(12) United States Patent
Hamada

(10) Patent No.: US 6,221,741 B1
(45) Date of Patent: Apr. 24, 2001

(54) PROCESS OF FABRICATING A SEMICONDUCTOR SUBSTRATE WITH SEMI-INSULATING POLYSILICON GETTERING SITE LAYER

(75) Inventor: Koji Hamada, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/078,764

(22) Filed: May 15, 1998

(30) Foreign Application Priority Data

May 16, 1997 (JP) .................................................. 9-143121

(51) Int. Cl.$^7$ ................................................. H01L 21/322
(52) U.S. Cl. .................... 438/476; 438/476; 438/471; 438/58
(58) Field of Search .................................... 438/476, 471, 438/478, 58

(56) References Cited

U.S. PATENT DOCUMENTS

| | | | |
|---|---|---|---|
| 3,997,368 | * 12/1976 | Petroff et al. | 148/1.5 |
| 4,053,335 | * 10/1977 | Hu | 148/174 |
| 4,608,096 | * 8/1986 | Hill | 148/33 |
| 4,803,528 | * 2/1989 | Pankove | 357/23.1 |

FOREIGN PATENT DOCUMENTS

| | | |
|---|---|---|
| 55-15286 | 2/1980 | (JP) . |
| 59-186331 | 10/1984 | (JP) . |
| 1-235242 | 9/1989 | (JP) . |
| 5-136153 | 6/1993 | (JP) . |
| 6-216137 | 8/1994 | (JP) . |
| 7-29911 | 1/1995 | (JP) . |

OTHER PUBLICATIONS

D.M. Lee et al., "Iron Gettering Efficiency By A Polysilicon Layer In P–Type CZ Silicon", *Journal of Electrochemical Society*, 1994, pp. 820–830.

* cited by examiner

Primary Examiner—Matthew Smith
Assistant Examiner—Granvill Lee
(74) Attorney, Agent, or Firm—Sughrue, Mion, Zinn, Macpeak & Seas, PLLC

(57) ABSTRACT

A semi-insulating polycrystalline silicon layer containing oxygen of at least 10 percent by atom is grown on a back surface of a single crystalline silicon wafer, and achieves high gettering efficiency at a thickness less than the thickness usual polycrystalline silicon so that the silicon substrate is less warped

3 Claims, 9 Drawing Sheets

PROCESS OF FABRICATING A SEMICONDUCTOR SUBSTRATE WITH SEMI-INSULATING POLYSILICON GETTERING SITE LAYER

FIELD OF THE INVENTION

This invention relates to a semiconductor wafer and a process of fabrication thereof and, more particularly, to a semiconductor wafer with a gettering site layer of semi-insulating polycrystalline silicon and a process of fabrication thereof.

DESCRIPTION OF THE RELATED ART

A semiconductor device has been enhanced in integration density. An integrated circuit is concurrently fabricated on a large diameter silicon wafer, and the device fabrication technology becomes complicated. An appropriate gettering technique is required for semiconductor devices in the next generation.

The denuded zone intrinsic gettering is a typical gettering technology for a silicon wafer. However, the denuded zone intrinsic gettering process requires long heat treatment for a large diameter silicon wafer, and the long heat treatment is costly.

A poly-back seal gettering is a kind of extrinsic gettering technology, and a polycrystalline silicon layer is formed on the back surface of a silicon wafer. The gettering efficiency of the polycrystalline silicon layer is dependent on the depositing conditions of polycrystalline silicon. The optimization of gettering efficiency is taught by D. M. Lee et. al. in "IRON GETTERING EFFICIENCY BY A POLYSILICON LAYER IN P-TYPE CZ SILICON", Journal of Electrochemical Society, pages 820 to 830, 1994.

FIG. 1 illustrates a semiconductor structure used in the experiments carried out by D. M. Lee et. al. The semiconductor structure consists of a single crystalline silicon layer 1 and a polycrystalline silicon layer 2 grown on the back surface of the single crystalline silicon layer 1. The single crystalline silicon layer 1 is grown through a Czochalski crystal growing technology, and the polycrystalline silicon layer 2 is grown under different conditions.

The polycrystalline silicon layer 2 of the first sample is grown to 0.8 micron thick at 700 degrees centigrade, the polycrystalline silicon layer 2 of the second sample is grown to 1.2 microns thick at 700 degrees centigrade, the polycrystalline silicon layer 2 of the third sample is grown to 1.6 microns thick at 700 degrees centigrade, and the polycrystalline silicon layer 2 of the fourth sample is grown to 1.2 microns thick at 620 degrees centigrade. Comparative samples are prepared through different gettering treatments. The first comparative sample is treated with etching instead of the deposition of polycrystalline silicon, and the second comparative sample is treated with sand blasting instead of the deposition of polycrystalline silicon. The six samples, i.e., the first sample to the fourth sample, the first comparative sample and the second comparative sample are contaminated with iron, and, thereafter, the residual iron is measured.

FIG. 2 illustrates the residual iron concentration, and FIG. 3 shows a series of microphotographs Sections A, B, C and D show the crystal structure of the second comparative sample, the crystal structure of first sample, the crystal structure of the second sample and the crystal structure of the third sample, respectively. As will be understood from FIG. 2, the thicker the polycrystalline silicon layer 2 is, the larger the gettering efficiency is 1.2 microns is the minimum thickness of the polycrystalline silicon layer 2 effective against the iron. Moreover, the low deposition temperature makes the crystal grain of the polycrystalline silicon small, and the small crystal grain reduces the gettering efficiency. The deposition around 700 degrees centigrade is appropriate. The microphotographs teach that high-dense twin crystal takes place during the solid state growth in the thin polycrystalline silicon layer such as the first sample. On the other hand, a large amount of grain boundary is left in the thick polycrystalline silicon layer such as the third sample after the CMOS heat treatment, and still has good gettering capability. Thus, the gettering efficiency is optimized by controlling the deposition temperature and the deposition time.

As taught by D. M. Lee, the large gettering efficiency requires the polycrystalline silicon of at least 1.2 microns thick, and the thick polycrystalline silicon layer 2 tends to warp the single crystalline silicon wafer 1. This is the first problem inherent in the prior art poly-back seal technology.

Another problem is that the gettering efficiency is reduced in a heat treatment repeated during a fabrication process of a semiconductor device. As described hereinbefore, much grain boundary achieves large gettering efficiency. However, the heat treatment promotes the solid phase growth in the polycrystalline layer 2, and the polycrystalline silicon layer loses the gettering capability. In order to restrict the solid phase growth from poly-crystal to single crystal, Japanese Patent Publication of Unexamined Application No. 1-235242 proposes an ion implantation of impurity serving as an inhibitor against the solid phase growth into a back surface portion of a single crystalline silicon wafer. The ion-implantation is carried out before the deposition of polycrystalline silicon on the back surface of the single crystalline silicon wafer, and nitrogen, oxygen and argon are examples of the inhibitor. The inhibitor prevents the polycrystalline silicon layer from decreasing thickness during a fabrication process for an integrated circuit. Thus, the inhibitor is effective against the heat treatment in the fabrication process of an integrated circuit. However, large gettering efficiency still requires the polycrystalline silicon layer equal to or greater than 1.2 microns thick, and the thick polycrystalline silicon layer is causative of the warp undesirably produced in the single crystalline silicon wafer.

SUMMARY OF THE INVENTION

It is therefore an important object of the present invention to provide a semiconductor substrate, which achieve good gettering efficiency without serious warp.

It is also an important object of the present invention to provide a process of fabricating the semiconductor substrate.

To accomplish the object, the present invention proposes to form a gettering site layer of semi-insulating polycrystalline silicon containing oxygen at least 10 percent by weight. The semi-insulating polycrystalline silicon contains oxygen at least ten percent by atom.

In accordance with one aspect of the present invention, there is provided a semiconductor substrate used for fabrication of a semiconductor device comprising an active layer formed of single crystalline semiconductor material and having a first surface used for fabricating at least one electric component thereon and a second surface reverse to the first surface, and a gettering site layer grown on the second surface of the active layer and formed of semi-insulating polycrystalline silicon containing oxygen of at least 10 percent by atom.

In accordance with another aspect of the present invention, there is provided a process of producing a semiconductor substrate used for a semiconductor device comprising the steps of preparing an active layer of single crystalline semiconductor material, and forming a gettering site layer formed of semi-insulating polycrystalline silicon containing oxygen of at least 10 percent by atom on one surface of the active layer.

BRIEF DESCRIPTION OF THE DRAWINGS

The features and advantages of the semiconductor wafer and the process will be more clearly understood from the following description taken in conjunction with the accompanying drawings in which.

DESCRIPTION OF THE PREFERRED EMBODIMENTS

First Embodiment

Figure 4:
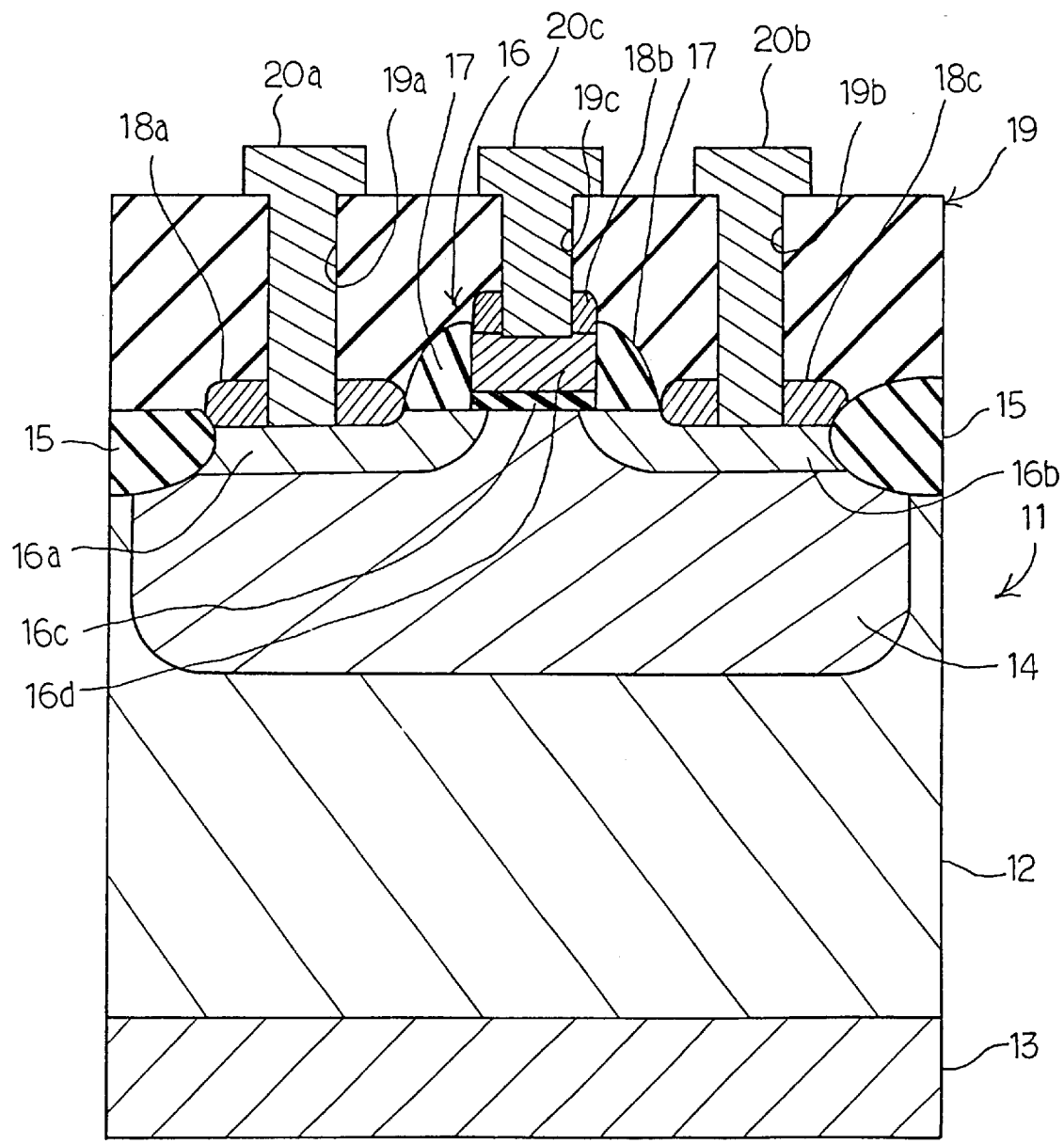
FIG. 4 is a cross sectional view showing the structure of a semiconductor device fabricated on a silicon substrate according to the present invention.

Referring to FIG. 4 of the drawings, a semiconductor device is fabricated on a silicon substrate 11 embodying the present invention. The silicon substrate 11 comprises an active layer 12 and a gettering site layer 13. The active layer 12 has a major surface and a back surface reverse to the major surface, and the gettering site layer 13 is grown on the back surface of the active layer 12. The active layer 12 is formed of single crystalline silicon, and the gettering site layer 13 is formed of semi-insulating polycrystalline silicon. The polycrystalline silicon contains oxygen of at least 10 percent by atom, and the oxygen imparts the semi-insulating property to the polycrystalline silicon.

In this instance, the single crystalline silicon is doped with n-type impurity, and a p-type well 14 is formed in a surface portion of the active layer 12. A thick field oxide layer 15 defines active areas, and one of the active areas is assigned to an n-channel type field effect transistor 16. Though not shown in FIG. 4, a p-channel type field effect transistor is formed in another active area, and forms a complementary field effect transistor together with the n-channel type field effect transistor 16.

The n-channel type field effect transistor 16 includes n-type source and drain regions 16a and 16b. The n-type source and drain regions 16a and 16b are formed in the p-type well 14, and are spaced from each other. The surface portion between the n-type source and drain regions 16a and 16b serves as a channel region. The n-channel type field effect transistor 16 further includes a thin gate insulating layer 16c and a gate electrode 16d. The channel region is overlain by the thin gate insulating layer 16c, and the gate electrode 16d is formed on the thin gate insulating layer 16c.

A pair of side wall spacers 17 is formed on both side surfaces of the gate electrode 16d, and titanium silicide layers 18a, 18b and 18c are formed on the n-type source and drain regions 16a/16b and the gate electrode 16d. The field effect transistors and the titanium silicide layers 18a/18b/18c are covered with an inter-level insulating layer 19, and through-holes 19a/19b/19c are formed in the inter-level insulating layer 19. The through-holes 19a/19b/19c are open at the upper surface of the inter-level insulating layer 19 and at the n-type source and drain regions 16a/16b and the gate electrode 16d. Metal wires 20a/20b/20c are patterned on the inter-level insulating layer 19, and are held in contact with the n-type source and drain regions 16a/16b and the gate electrode 16d through the through-holes 19a/19b/19c, respectively. The metal wire 20b supplies the ground potential level to the n-type source region 16a, and the metal wire 20b is connected to the drain region of the p-channel type field effect transistor, and the metal wire 20c supplies an input signal to the gate electrode 16d and the gate electrode of the p-channel type field effect transistor. Thus, the n-channel type field effect transistor 16 and the p-channel type field effect transistor form in combination the complementary field effect transistor.

The semiconductor device shown in FIG. 4 is fabricated as follows. First, a single crystalline silicon wafer 30 is prepared. A part 30a of the single crystalline silicon wafer 30 serves as the active layer 12 assigned to the semi-conductor device.

Subsequently, semi-insulating polycrystalline silicon is deposited to 800 nanometers thick over the entire back surface of the single crystalline silicon wafer 30 by using a low-pressure chemical vapor deposition technique, and forms a semi-insulating polycrystalline silicon layer 31. A part 31a of the semi-insulating polycrystalline silicon layer 31 is located on the active layer 12, and serves as the gettering site layer 13. Thus, the lamination of the part 30a of the wafer 30 and the part 31a of the semi-insulating polycrystalline layer 31 serve as the semiconductor substrate 11.

The present inventor grew the polycrystalline silicon under the different depositing conditions. The polycrystalline silicon wad deposited at 650 degrees centigrade, and the gaseous mixture of $N_2O/SiH_4$ was introduced into the reactor of the low-pressure chemical vapor deposition system. The present inventor changed the ratio of $N_2O/SiH4$ as shown in Table 1, and measured the oxygen content.

TABLE 1

| Sample | Ratio of $N_2O/SiH_4$ | Oxygen content at % |
|---|---|---|
| 1 | 0.01 | 10 |
| 2 | 0.05 | 35 |
| 3 | 0.10 | 35 |

Thus, the gas flow ratio of $N_2O$ to $SiH_4$ affected the oxygen content of the polycrystalline silicon, and the minimum gas flow ratio for the semi-insulating polycrystalline silicon was 0.01.

Using the semiconductor substrate 11, the complementary field effect transistor is fabricated. Although the p-channel type field effect transistor and the n-channel type field effect transistor 16 are fabricated on the semiconductor substrate 11, description is focused on the n-channel type field effect transistor 16.

Figure 5A:
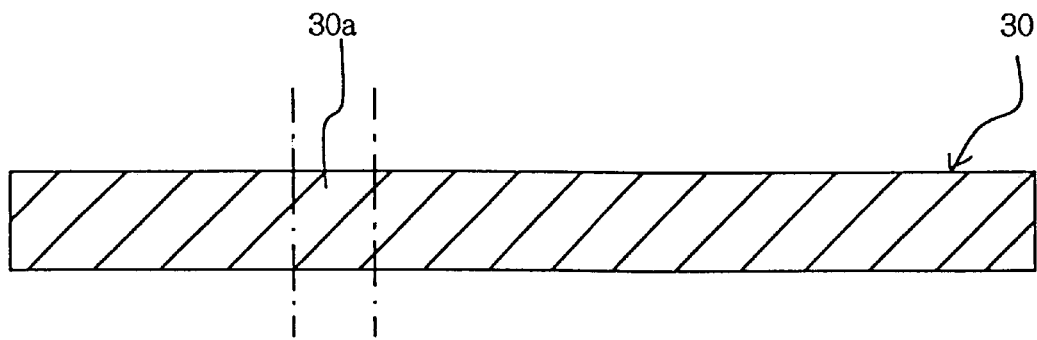
FIGS. 5A to 5F are cross sectional views showing a process of fabricating a semiconductor device according to the present invention.
Figure 5B:
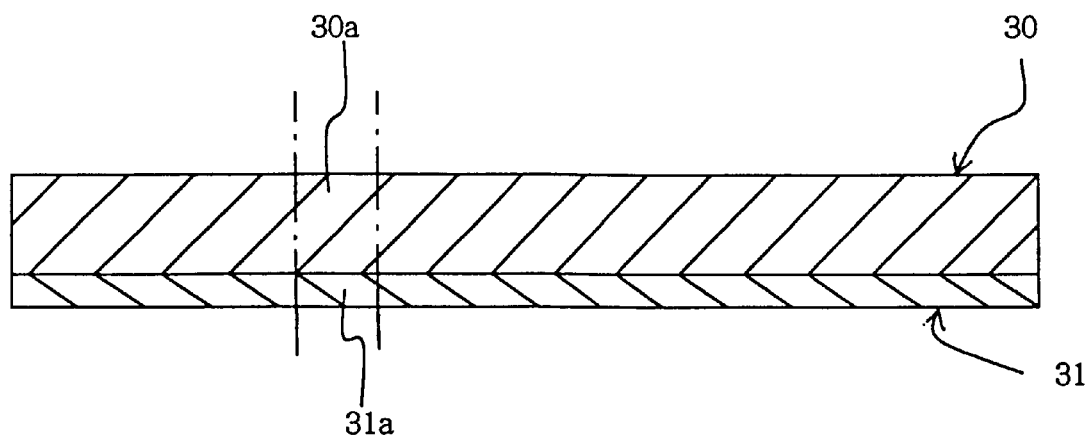
Figure 5C:
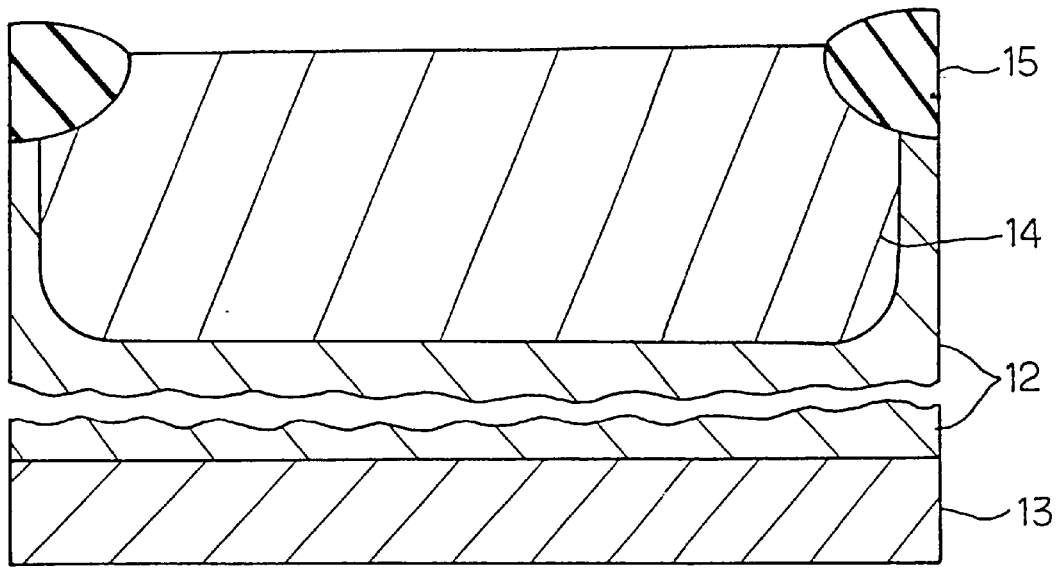

First, the thick field oxide layer 15 is selectively grown by using the local oxidation of silicon technology, and boron is ion implanted into the surface portion of the active layer 12 at 300 KeV. The resultant structure is annealed at 1000 degrees centigrade, and the ion-implanted boron forms the p-type well 14 as shown in FIG. 5C.

Figure 5D:
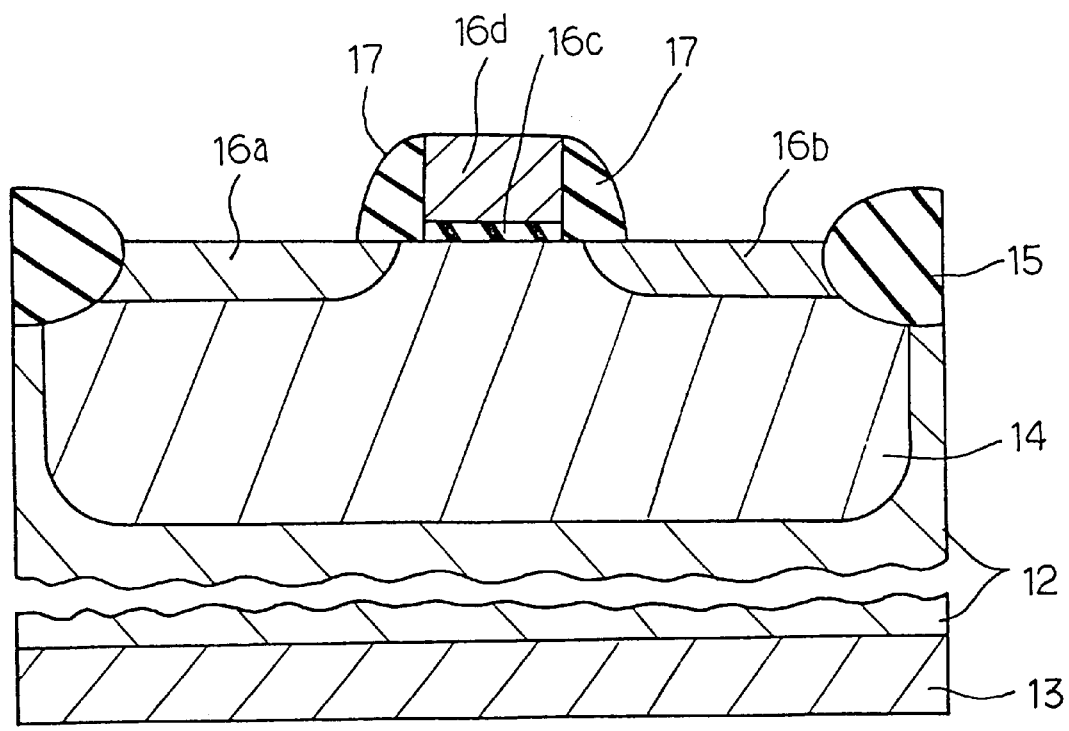

The thin gate insulating layer 16c is thermally grown to 6 nanometers on the p-type well 14. Polycrystalline silicon is deposited over the entire surface of the resultant semiconductor structure, and the polycrystalline silicon layer is patterned into the gate electrode 16d by using lithographic techniques and an etching. Insulating material such as silicon oxide is deposited over the entire surface of the resultant semiconductor structure, and an insulating layer topographically covers the thick field oxide layer 15, the p-type well 14 and the gate electrode 16d. The insulating layer is anisotropically etched away, and the side wall spacers 17 are left on both side surfaces of the gate electrode 16d. Arsenic is ion implanted into the p-type well 14 at dosage of $1 \times 10^{15}$ cm$^{-2}$ under the acceleration energy of 10 KeV, and is activated through heat treatment at 950 degrees centigrade. Then, the n-type source and drain regions 16a and 16b are formed in the p-type well 14 as shown in FIG. 5D.

Figure 5E:
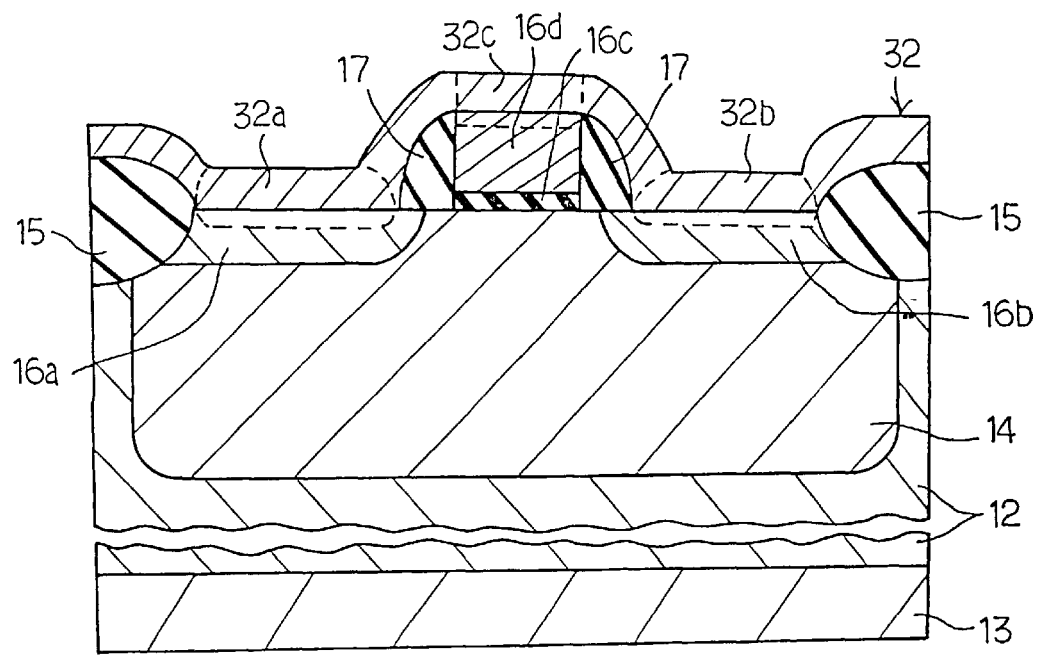

Subsequently, titanium is deposited over the entire surface of the resultant semiconductor structure by using a sputtering, and a titanium layer 32 topographically extends. The first sintering is carried out at 690 degrees centigrade, and, thereafter, the second sintering is carried out at 800 degrees centigrade. The titanium reacts with silicon during the sintering, and the titanium layer 32 is partially converted to titanium silicide portions 32a, 32b and 32c as shown in FIG. 5E.

Figure 5F:
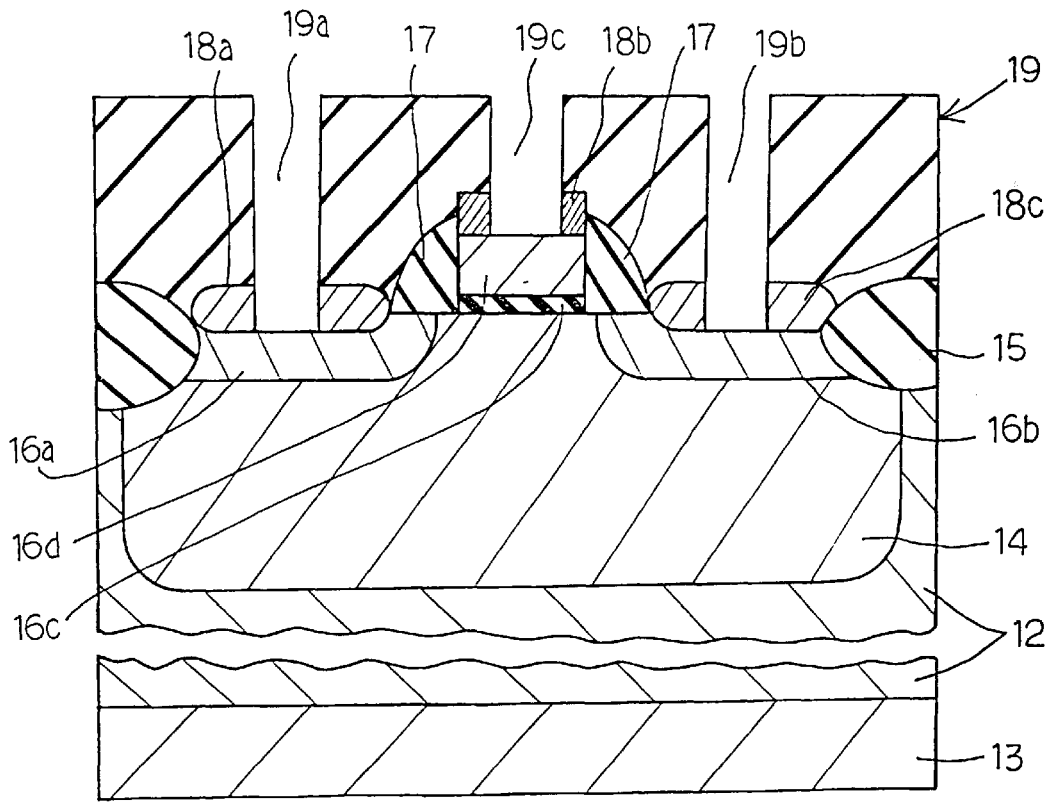

The residual titanium is etched away, and the titanium silicide layers 18a/18b/18c are left on the n-type source region 16a, the gate electrode 16d and the n-type drain region 16b, respectively. Insulating material is deposited over the entire surface of the resultant semiconductor structure, and forms the inter-level insulating layer 19. The inter-level insulating layer 19 is reflowed at 800 degrees centigrade. A photo-resist etching mask (not shown) is formed on the inter-level insulating layer 19, and has openings over the n-type source and drain regions 16a/16b and the gate electrode 16d. The inter-level insulating layer 19 and the titanium silicide layers 18a/18c/18b are selectively etched away so as to form the contact holes 19a/19b/19c as shown in FIG. 5F.

Conductive metal is deposited over the entire surface of the resultant semiconductor structure. The conductive metal fills the contact holes 19a/19b/19c, and swells into a conductive metal layer. A photo-resist etching mask (not shown) is provided on the conductive metal layer, and the conductive metal layer is patterned into the metal wires 20a, 20b and 20c as shown in FIG. 4.

The present inventor fabricated samples I, II and III of the semiconductor device through the process described hereinbefore, and two comparative samples were further prepared through the same process. The single crystal silicon wafers were obtained from a single crystal silicon rod grown through a floating zone method. The first comparative sample was without any gettering site layer of polycrystalline silicon, and the second comparative sample had a gettering site layer of polycrystalline silicon taught by D. M. Lee et al. The thickness and the oxygen content were summarized in Table 2.

TABLE 2

|  | Oxygen (at %) |
| --- | --- |
| Sample I | 10 |
| Sample II | 35 |
| Sample III | 55 |

Figure 6:
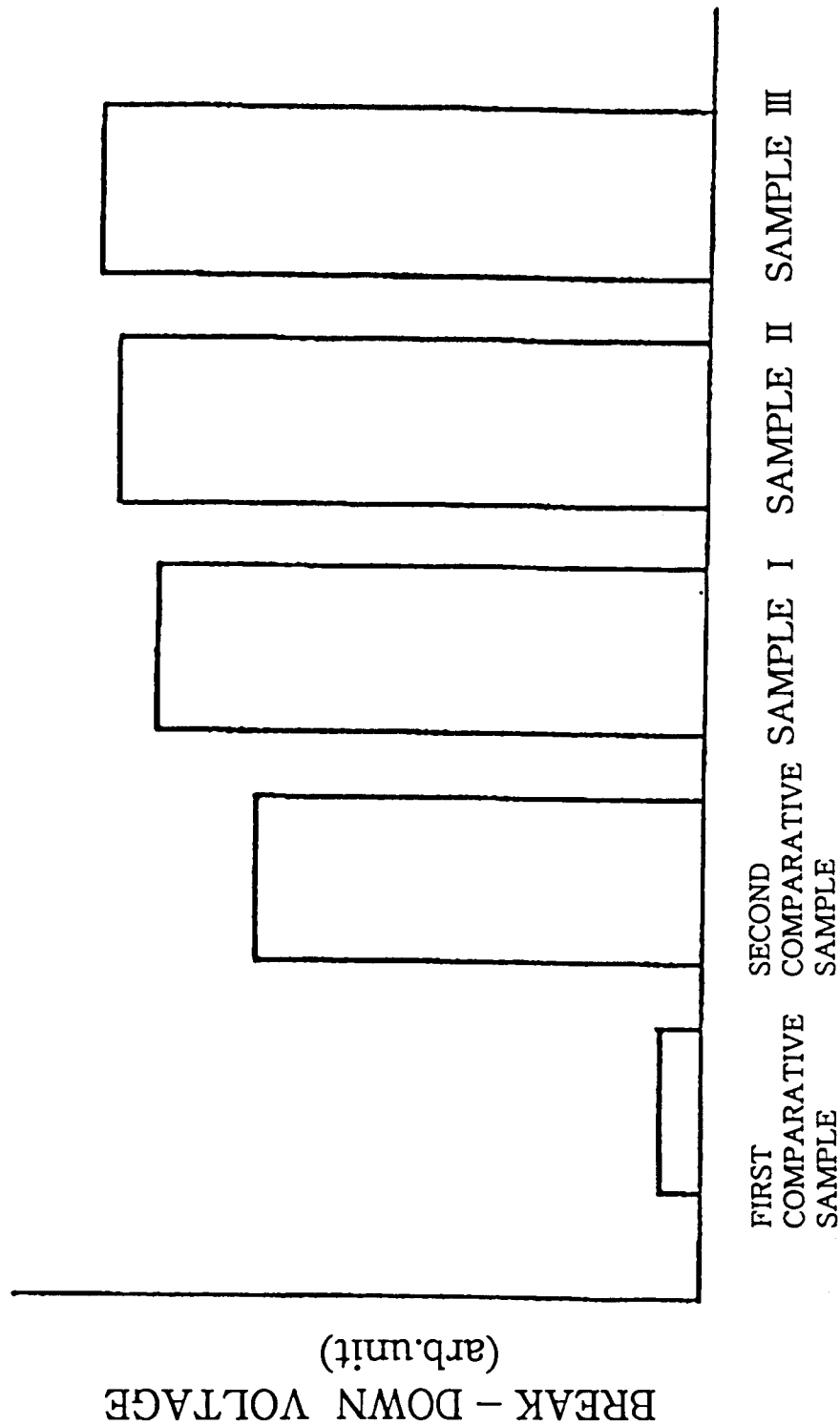
FIG. 6 is a graph showing the initial break-down voltage measured by the present inventor.
Figure 7:
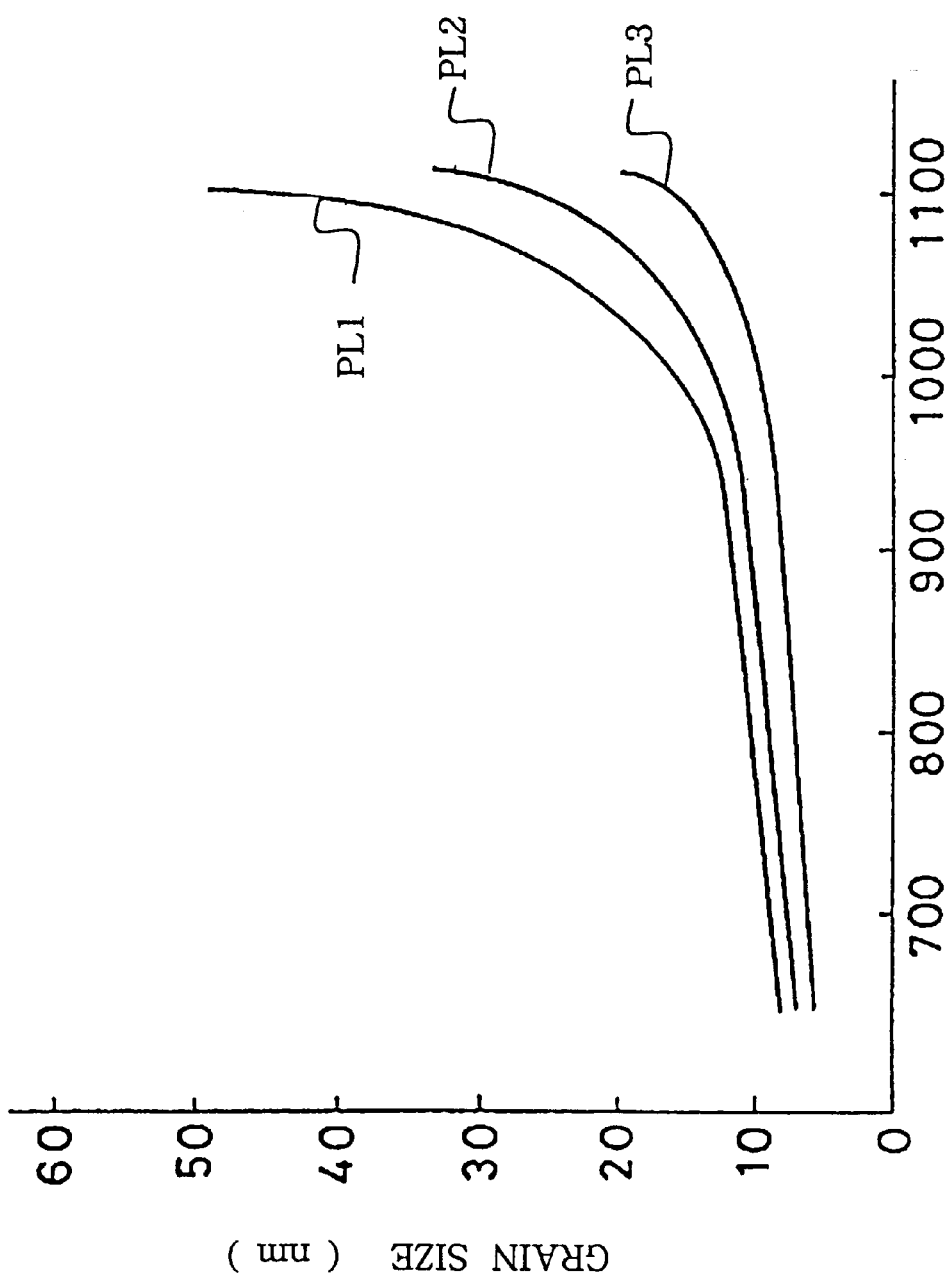
FIG. 7 is a graph showing variation of grain size in terms of oxygen content of semi-insulating polycrystalline silicon after an annealing.

After the fabrication of the semiconductor device, the first comparative sample, the second comparative sample and samples I, II and III were contaminated with iron. The present inventor applied potential to the gate electrodes 16d of each sample, and measured the initial break-down voltage of the gate insulating layer 16c. The initial break-down voltage was plotted in FIG. 6, and the gettering site layers of the semi-insulating polycrystalline silicon were superior to the prior art gettering site layer of polycrystalline silicon. The initial breakdown voltage was increased together with the oxygen content of the semi-insulating polycrystalline silicon.

Figure 1:
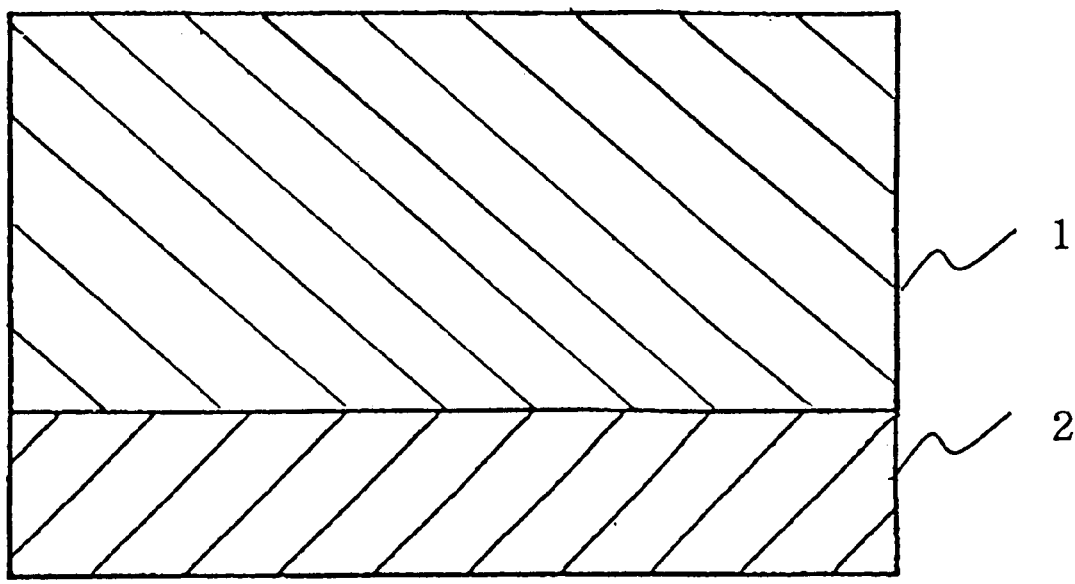
FIG. 1 is a cross sectional view showing the structure of a silicon wafer treated through the poly-back seal gettering.
Figure 2:
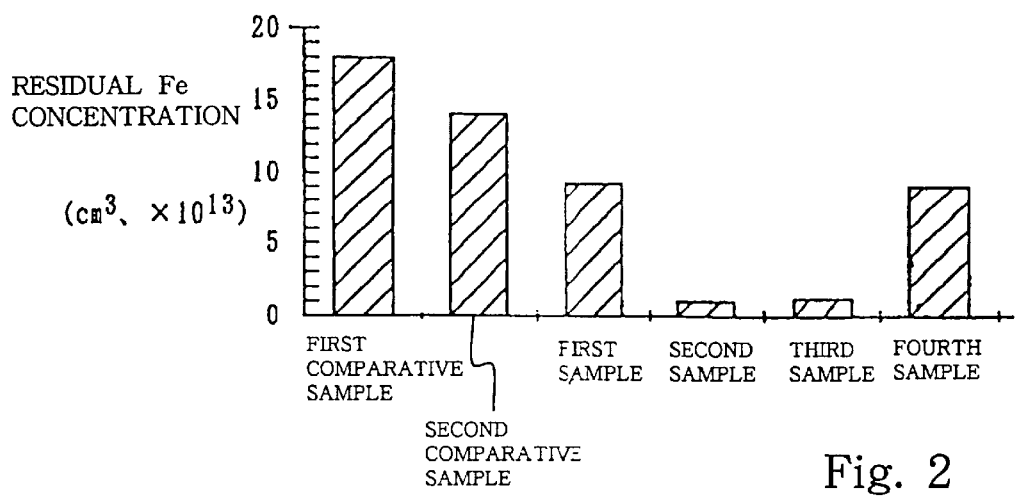
FIG. 2 is a graph showing the residual iron concentration of the samples disclosed in the paper.
Figure 3:
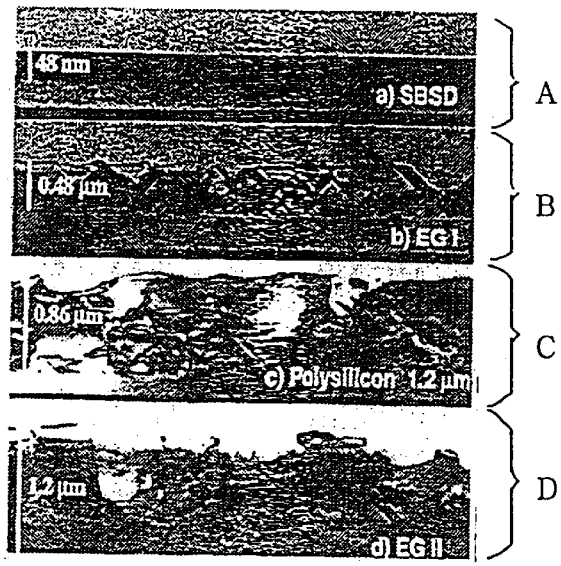
FIG. 3 is a series of microphotographs showing the crystal structure of a samples disclosed in the paper.

The present inventor investigated the influence of oxygen on the grain size after an annealing. The present inventor treated the samples I, II and III with heat, and measured the grain size. Plots PL1, PL2 and PL3 were indicative of the variation in grain size of polycrystalline silicon for the samples I, II and III, respectively. It was understood from plots PL1, PL2 and PL3 that the grain size was stable until 1000 degrees in centigrade, and the stability was dependent on the oxygen content. The oxygen formed a silicon oxide layer along the grain boundary, and the silicon oxide layer prevented the polycrystalline silicon grains from solid phase growth. The large gettering efficiency was derived from the stability of grain size. The grain size was drastically grown in the prior art gettering site layer of polycrystalline silicon proposed by D. M. Lee (see FIG. 3). This meant that the polycrystalline silicon did not contain the oxygen of at least 10 percent by weight.

The present inventor further investigated the gettering site layer of semi-insulating polycrystalline silicon and the prior art gettering site layer proposed by D. M. Less et al in view of warp. When the gettering site layer of semi-insulating polycrystalline silicon was equal in gettering efficiency to the prior art gettering site layer of polycrystalline silicon, the thickness of the semi-insulating polycrystalline silicon was less than that of the prior art polycrystalline silicon, and the warp was decreased.

As will be understood from the foregoing description, the gettering site layer of semi-insulating polycrystalline silicon decreases the warp of the semiconductor substrate without reduction of gettering efficiency.

Second Embodiment

Figure 8:
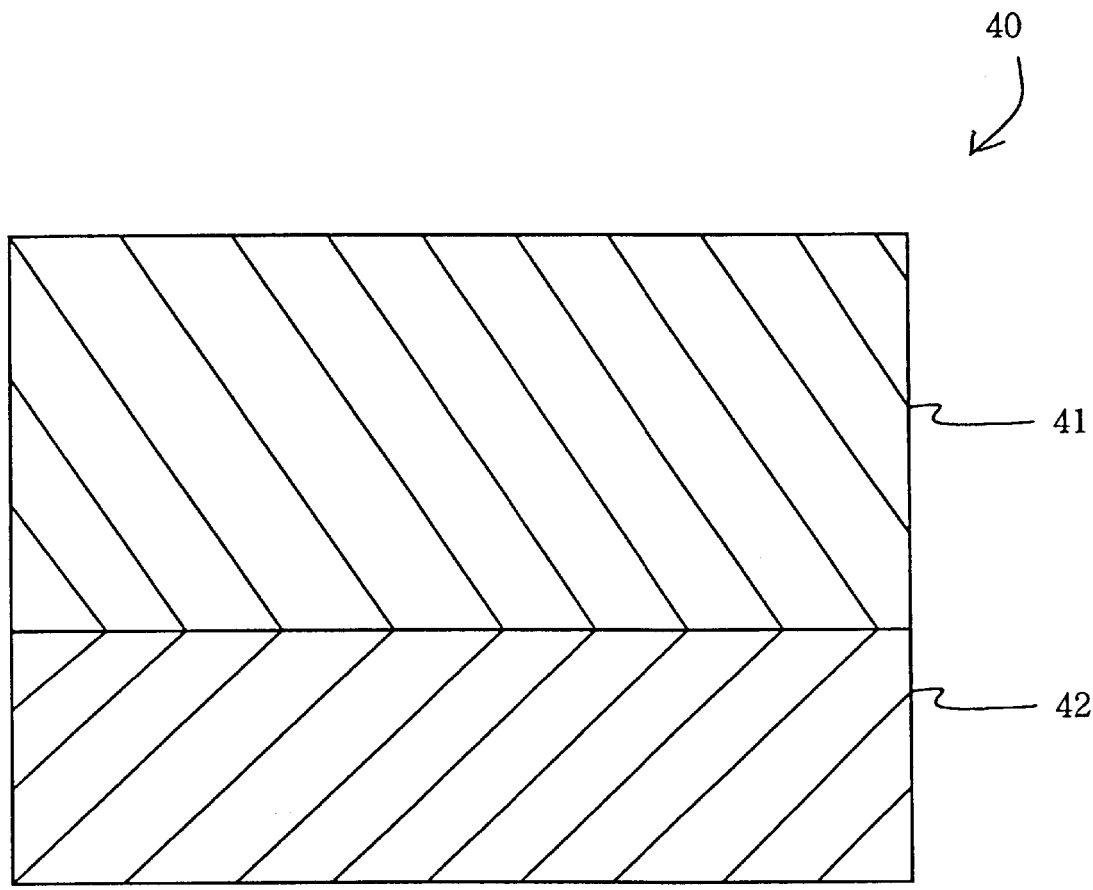
FIG. 8 is a cross sectional view showing the structure of another silicon substrate according to the present invention.

FIG. 8 illustrates the structure of another semiconductor substrate 40 embodying the present invention. The semiconductor substrate 40 is produced as follows. First, a single crystalline silicon wafer 41 is prepared, and semi-insulating boron-doped polycrystalline silicon is grown to 800 nanometers thick at 650 degrees centigrade by using a low-pressure chemical vapor deposition. Material gas contains $N_2O$, $SiH_4$ and $B_2H_6$. The ratio of $N_2O/SiH_4$ is adjusted to 0.05. As a result, a semi-insulating boron-doped polycrystalline silicon layer is formed on the back surface of the single crystalline silicon wafer 41, and serves as a gettering site layer 42.

Using the semiconductor substrate 40, a complementary field effect transistor is fabricated as follows. Description is focused on an n-channel enhancement type field effect transistor as similar to the first embodiment. A thick field oxide layer is grown by using the local oxidation of silicon techniques, and born is ion implanted into a surface portion of the semiconductor substrate 40 under the acceleration energy of 300 KeV. The resultant semiconductor structure is treated with beat at 1000 degrees centigrade, and the boron forms a p-type well.

A thin gate insulating layer is grown to 6 nanometers thick, and a gate electrode and side wall spacers are formed. Arsenic is ion implanted into the p-type well in a self-aligned manner with the side wall spacers at dosage of $1\times10^{15}$ cm$^{-2}$ under the acceleration energy of 10 KeV, and the arsenic is activated through an annealing at 950 degrees centigrade. The arsenic forms a source region and a drain region.

Titanium is deposited over the entire surface of the resultant semiconductor structure, and titanium silicide layers are produced on the source/drain regions and the gate electrode through the first sintering at 690 degrees centigrade and the second sintering at 800 degrees in centigrade. The residual titanium is etched away.

An inter-level insulating layer is formed over the resultant semiconductor structure, and is reflowed at 800 degrees centigrade. Contact holes are formed in the inter-level insulating layer, and reach the source and drain regions and the gate electrode through the titanium silicide layers. Conductive metal is deposited over the entire surface of the resultant semiconductor structure, and the conductive metal layer is patterned into metal wires.

In the second embodiment, the boron is doped into the semi-insulating polycrystalline silicon layer. The boron is replaceable with phosphorous. The phosphorous also enhances the gettering capability of the semi-insulating polycrystalline silicon layer.

The semi-insulating polycrystalline silicon layer 42 is doped with boron, and the boron enhances the gettering efficiency of the semi-insulating polycrystalline crystalline silicon. As a result, the manufacturer can decrease the gettering site layer, and the thin gettering site layer reduces the warp.

Although particular embodiments of the present invention have been shown and described, it will be obvious to those skilled in the art that various changes and modifications may be made without departing from the spirit and scope of the present invention.

For example, the boron or the phosphorous may be introduced into the semi-insulating polycrystalline silicon layer after the growth.

What is claimed is:

1. A process of producing a silicon substrate used for a semiconductor device, comprising the steps of:

a) preparing a single crystalline silicon substrate having a first main surface on which said semiconductor device is to be formed;

b) forming a gettering site layer on a second main surface of said single crystalline silicon substrate, said second main surface being opposite to said first main surface, said gettering site layer being formed of semi-insulating polycrystalline silicon containing oxygen of at least 10 percent by atom on one surface of said active layer; and c) doping said semi-insulating polycrystalline silicon layer with either phosphorus or boron.

2. The process as set forth in claim 1, in which said phosphorus or said boron is introduced in said semi-insulating polycrystalline silicon during a growth in said step b).

3. The process as set forth in claim 1, in which said semi-insulating polycrystalline silicon layer is grown to a certain thickness less than 1.2 microns.

* * * * *